United States Patent [19]
Shimoto et al.

[11] Patent Number: 6,150,074
[45] Date of Patent: *Nov. 21, 2000

[54] METHOD OF FORMING ELECTRICALLY CONDUCTIVE WIRING PATTERN

[75] Inventors: Tadanori Shimoto; Koji Matsui, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/033,356

[22] Filed: Mar. 2, 1998

[30] Foreign Application Priority Data

Mar. 5, 1997 [JO] Jordan ................................ 9-049527

[51] Int. Cl.$^7$ ........................................................ G03F 7/26
[52] U.S. Cl. ............................ 430/314; 430/329; 427/98
[58] Field of Search ...................................... 430/313, 314, 430/394, 329; 427/123, 124, 305, 304, 98

[56] References Cited

U.S. PATENT DOCUMENTS

| | | | |
|---|---|---|---|
| 4,732,838 | 3/1988 | Sechi et al. | 430/198 |
| 5,173,392 | 12/1992 | Miersch et al. | 430/311 |
| 5,648,125 | 7/1997 | Cane | 427/534 |
| 5,714,247 | 2/1998 | Kuo | 428/323 |
| 5,747,222 | 5/1998 | Ryu | 430/312 |
| 5,879,854 | 3/1999 | Tomita et al. | 430/272.1 |

FOREIGN PATENT DOCUMENTS

| | | |
|---|---|---|
| 63-289988 | 11/1988 | Japan . |
| 5263216 | 10/1993 | Japan . |
| 6140393 | 5/1994 | Japan . |

*Primary Examiner*—Kathleen Duda
*Attorney, Agent, or Firm*—Hayes, Soloway, Hennessey, Grossman & Hage, PC

[57] ABSTRACT

There is provided a method of forming an electrically conductive wiring pattern, including the steps of patterning a resist on a substrate so that the resist has at least one recess where an electrically conductive wiring is to be formed, the substrate appearing in the recess, the resist being composed of silicon dioxide particles having a diameter of 5 μm or smaller and epoxy acrylate having a fluorene skeleton, etching the resist by plasma-ashing so that the silicon dioxide particles appear on a surface of the resist, forming a metal film over both the resist and the substrate appearing in the recess, and removing the metal film formed on the resist by removing the silicon dioxide particles appearing on a surface of the resist. The above-mentioned method provides a fine, highly accurate, electrically conductive wiring pattern without wiring disconnection and short-circuit

44 Claims, 4 Drawing Sheets

METHOD OF FORMING ELECTRICALLY CONDUCTIVE WIRING PATTERN

BACKGROUND OF THE INVENTION

1. Field of the Invention

The invention relates to a method of forming an electrically conductive wiring pattern, and more particularly to a method of forming an electrically conductive wiring pattern on a substrate on which electronic devices such as semiconductor devices are to be mounted.

2. Description of the Related Art

As a conventional method of forming an electrically conductive wiring pattern on a substrate on which semiconductor devices are to be mounted, there are known (a) the subtractive process including the steps of adhering a copper foil onto a substrate, forming a resist pattern on the copper foil, and etching the copper foil by using the resist as a mask, (b) a dry process such as sputtering and evaporation, and (c) the semi-additive process including the steps of forming an underlying metal film on a substrate by a wet process such as electroless deposition, forming a resist pattern on the metal film, precipitating the metal in selected regions by electrolytic plating, and etching the underlying metal film.

However, an electrically conductive wiring pattern formed by whichever process projects beyond a substrate. Hence, when an insulating layer was formed on the wiring pattern and another electrically conductive wiring pattern was further formed on the insulating layer to thereby form a multi-layered wiring structure, it was difficult to form the insulating layer thin and form the multi-layered wiring structure having a planarized surface without a step for ensuring reliable insulating between the upper and lower wiring patterns.

In order to solve this problem, there has been suggested the additive process having the steps of forming a resist pattern directly on a substrate, and precipitating metal in selected regions by electroless deposition to thereby form an electrically conductive wiring pattern. The additive process makes it relatively easy for the electrically conductive wiring pattern to have the same thickness as that of a resist pattern, and hence provides a product having a planarized surface without steps which would be caused by wiring patterns. In addition, the additive process makes it possible to form an insulating layer thinner.

However, since the resist is patterned after a catalyst has been absorbed into a substrate in the above-mentioned processes, the processes are inevitably accompanied with problems that the catalyst is removed in a step of developing the resist, which causes wiring disconnection because of no precipitation of metal, and reduction in adhesion between the resist and the substrate. In addition, since the catalyst is absorbed into the substrate in regions where an electrically conductive wiring pattern is not to be formed, migration of metal ions is likely to take place, which reduces reliability of a final product. These problems become more remarkable in a wiring pattern having a higher density and a smaller width.

There has been also suggested a method wherein catalytic treatment is carried out after the formation of a resist pattern. However, a catalyst is absorbed into a surface of the resist pattern in this method. Accordingly, a metal film is deposited onto a substrate by electroless deposition, there is caused a problem that a bridge is generated between the resist and a metal film with the result of poor insulation therebetween. Hence, this method is not suitable to the formation of a wiring pattern having a higher density and a smaller width.

As a solution to the above-mentioned problems in the additive process, Japanese Unexamined Patent Publication No. 63-289988 has suggested a method of forming an electrically conductive wiring pattern, which includes the steps of forming a substrate having recesses where an electrically conductive wiring pattern is to be formed, forming a thin metal film entirely over the substrate, mechanically removing the thin metal film formed on the resist so that the thin metal film formed in the recesses is left as it is, and forming another metal film on the thin metal film in the recesses by plating.

The method suggested in Japanese Unexamined Patent Publication No. 63-289988 is explained hereinbelow with reference to FIGS. 1A to 1E. First, as illustrated in FIG. 1A, there is formed a substrate 31 having a plurality of recesses 32 at a surface thereof. Then, as illustrated in FIG. 1B, a catalyst layer 33 is formed entirely over the substrate 31. Then, a thin metal film 35 is formed over the substrate 31 by electroless deposition, as illustrated in FIG. 1C. Then, the thin metal film 35 is mechanically removed except portions formed in the recesses 32. As a result, as illustrated in FIG. 1D, a pattern 36a is formed only in the recesses 32. Then, as illustrated in FIG. 1E, the recesses 32 are filled with another metal by plating to thereby form an electrically conductive wiring pattern 36 in the recesses 32 of the substrate 31.

In the method illustrated in FIGS. 1A to 1E, the unwanted portions of the thin metal film 35 are mechanically removed to thereby form the pattern 36a. Herein, the mechanical removal is carried out by means of abrasive materials such as sandpaper and buffers. Hence, if abrasive powders in those abrasive materials had non-uniform diameters, the pattern 36a which is meant to be left as it is in the recesses 32 might be damaged, resulting in a problem of disconnection of the pattern 36a.

It would be possible to avoid the disconnection of the pattern 36a to some degree by employing abrasive powders having smaller diameters. However, as the smaller diameter abrasive powders could provide smaller abrasive force, some portions of the thin metal film 35 which have to be removed would not be removed, in particular, when a pattern is to be formed in a higher density and a smaller width, resulting in poor insulation which would cause short-circuit problems. This problem would become remarkable in a substrate having a greater area, resulting in considerable reduction in a fabrication yield of a device.

Japanese Unexamined Patent Publication No. 5-263216 has suggested another method of forming a metal pattern on a substrate, including the steps of forming a first $SiO_2$ layer and a second $2MgO$—$SiO_2$ layer on a substrate, forming a resist pattern on the second layer, etching the first and second layers in selected regions with the resist pattern being used as a mask, to thereby form pattern recesses, removing the resist pattern, depositing a metal layer on a surface of the second layer and the pattern recesses, removing the metal layer deposited on a surface of the second layer so that at least a part of the metal layer in the pattern recesses is left as it is and at least a part of the second layer is exposed, and removing the second layer. According to the Publication, the suggested method provides stable lift-off and a pattern having no deformation.

Japanese Unexamined Patent Publication No. 6-140393 has suggested a method of forming an electrode wiring, including the steps of forming an oxide film on a silicon substrate by thermal oxidation, forming the oxide film with a plurality of recesses, forming a thin aluminum film over the oxide film, heating the silicon substrate with a natural oxide film being avoided to generate on a surface of the thin aluminum film, to thereby melt the aluminum film, and filling the recesses with the molten aluminum to thereby form an aluminum electrode wiring.

SUMMARY OF THE INVENTION

It is an object of the present invention to provide a method of forming an electrically conductive wiring pattern without disconnection of a pattern and short-circuit problems, which method is capable of providing an electrically conductive wiring pattern in a higher density and a smaller width, and also providing a greater fabrication yield even if the pattern is to be formed in a large area. It is also an object of the present invention to provide a method of forming a multi-layered wiring structure having a planarized surface without steps caused by wiring patterns, and also having reliability with respect to insulation between upper and lower wiring patterns.

There is provided a method of forming an electrically conductive wiring pattern, including the steps of (a) patterning a resist containing particles therein on a substrate so that the resist has at least one recess where an electrically conductive wiring is to be formed, the substrate appearing in the recess, (b) etching the resist so that the particles appear on a surface of the resist, (c) forming a metal film over both the resist and the substrate appearing in the recess, and (d) removing the metal film formed on the resist by removing the particles appearing on a surface of the resist.

The metal film may be formed in the step (c) so as to have the same height as that of the resist. As an alternative, the metal film may be formed in the step (c) so as to have a smaller height as a height of the resist, in which case the method may further include the step (e) of forming a second metal film on the metal film. This makes it possible to form an electrically conductive wiring pattern having a desired thickness. In this step (e), the second metal film may be formed so that a total height of the metal film and the second metal film is equal to a height of the resist. The second metal film may be composed of a metal different from a metal of which the metal film is composed. For instance, the second metal film may be comprised of a plurality of layers.

It is preferable that the particles are composed of metal oxide. For instance, the etching in the step (b) may be carried out by plasma-ashing.

There is further provided a method of forming a multi-layered wiring structure, including the steps of (a) patterning a resist containing particles therein on a substrate so that the resist has at least one recess where an electrically conductive wiring is to be formed, the substrate appearing in the recess, (b) etching the resist so that the particles appear on a surface of the resist, (c) forming a metal film over both the resist and the substrate appearing in the recess, (d) removing the metal film formed on the resist by removing the particles appearing on a surface of the resist, (e) forming an interlayer insulating film over the product of the step (d), (f) forming a via-hole leading to the metal film formed over the substrate appearing in the recess, (g) patterning a resist containing particles therein on the product of the step (f) so that the resist has at least one recess where an electrically conductive wiring is to be formed, the product of the step (f) appearing in the recess, (h) repeating steps (b) to (g) a desired number of times, and (i) repeating steps (b) to (d).

There is still further provided a method of forming an electrically conductive wiring pattern, including the steps of (a) patterning a resist containing silicon dioxide particles therein on a substrate so that the resist has at least one recess where an electrically conductive wiring is to be formed, the substrate appearing in the recess, (b) etching the resist so that the silicon dioxide particles appear on a surface of the resist, (c) forming a metal film over both the resist and the substrate appearing in the recess, and (d) removing the metal film formed on the resist by removing the silicon dioxide particles appearing on a surface of the resist.

It is preferable that the resist is composed of silicon dioxide particles having a diameter of 5 $\mu$m or smaller, more preferably, 1 $\mu$m or smaller, and epoxy acrylate having a fluorene skeleton. For instance, the silicon dioxide particles may be removed in the step (d) by spray-flush.

It is preferable that the metal film is formed in the step (c) in a dry atmosphere, for instance, by sputtering or evaporation. It is preferable that the resist such as polyimide is composed of photosensitive resin containing silicon dioxide particles therein. It is preferable that the etching in the step (b) is carried out by plasma-ashing.

It is preferable that the metal film is formed in the step (c) so as to have a smaller height as a height of the resist, in which case, the method may preferably include the step (e) of forming a second metal film on the metal film. The second metal film is formed so that a total height of the metal film and the second metal film is equal to a height of the resist. The metal film may be comprised of a plurality of layers including at least a copper layer and a palladium layer. For instance, the second metal film may be composed of copper. It is preferable that the second film is formed by electroless deposition.

There is yet further provided a method of forming a multi-layered wiring structure, including the steps of (a) patterning a resist containing silicon dioxide particles therein on a substrate so that the resist has at least one recess where an electrically conductive wiring is to be formed, the substrate appearing in the recess, (b) etching the resist so that the silicon dioxide particles appear on a surface of the resist, (c) forming a metal film over both the resist and the substrate appearing in the recess, (d) removing the metal film formed on the resist by removing the silicon dioxide particles appearing on a surface of the resist, (e) forming an interlayer insulating film over the product of the step (d), (f) forming a via-hole leading to the metal film formed over the substrate appearing in the recess, (g) patterning a resist containing silicon dioxide particles therein on the product of the step (f) so that the resist has at least one recess where an electrically conductive wiring is to be formed, the product of the step (f) appearing in the recess, (h) repeating the steps (b) to (g) in the desired numbers, and (i) repeating the steps (b) to (d).

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1A:
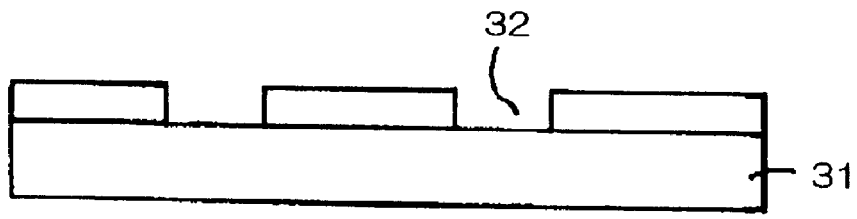
FIGS. 1A to 1E are cross-sectional views of a substrate on which an electrically conductive wiring pattern is formed, illustrating respective steps in a conventional method of forming an electrically conductive wiring pattern.
Figure 1B:
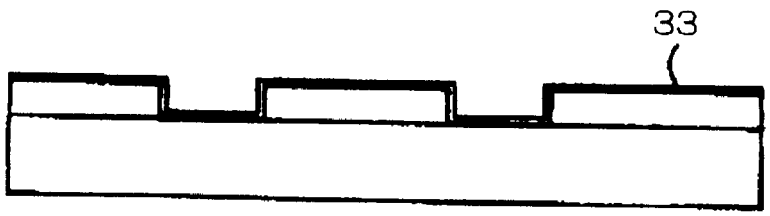
Figure 1C:
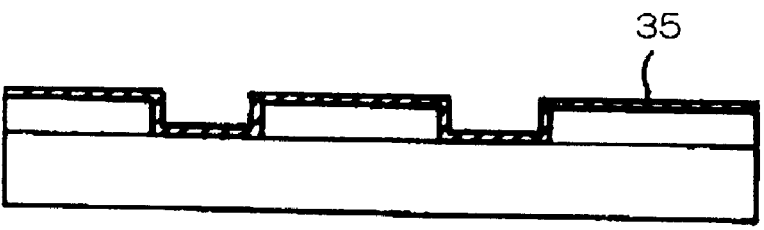
Figure 1D:
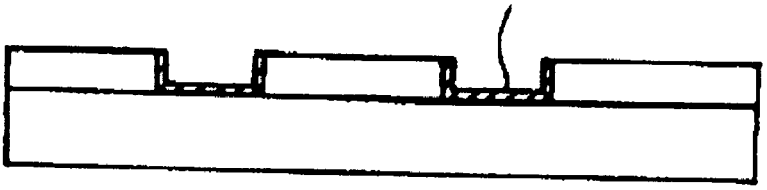
Figure 1E:
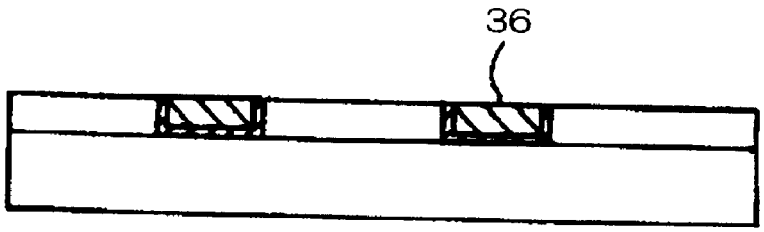
Figure 2A:
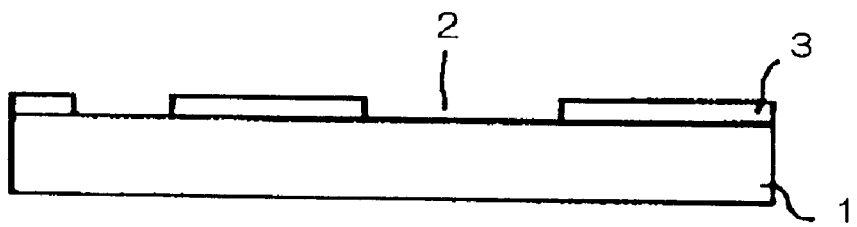
FIGS. 2A to 2E are cross-sectional views of a substrate on which an electrically conductive wiring pattern is formed, illustrating respective steps in a method of forming an electrically conductive wiring pattern in accordance with the first embodiment of the present invention.

The method of forming an electrically conductive wiring pattern in accordance with the first embodiment is explained hereinbelow with reference to FIGS. 2A to 2E. First, as illustrated in FIG. 2A, a resist 3 is patterned on a substrate 1 so that the resist 3 has a plurality of recesses 2 where an electrically conductive wiring pattern is to be formed, as follows. The substrate 1 is made of alumina ceramics, and the resist 3 contains silica or silicon dioxide ($SiO_2$) particles therein.

There is used a coating agent composed of a mixture of photosensitive polyimide varnish, available from Asahi Chemistry Industry Co. Ltd., under the tradename of G-7613N, and molten silica particles having a diameter of 10 $\mu$m with a mixture weight ratio: polyimide varnish:molten silica particles=10:1. The coating agent is applied to cover entirely a surface of the substrate 1 by spin-coating so that the resist 3 has a thickness of a few micrometers ($\mu$m) after drying. Then, the coating agent is dried at 80° C. for 20 minutes, exposed to a light at 600 mJ/cm$^2$, developed in a solution containing $\gamma$-butyrolactone as a major constituent, and then cured by being heated at 350° C. for one hour in nitrogen atmosphere. Thus, the resist 3 having a plurality of the recesses 2 is formed on the substrate 1.

Figure 2B:
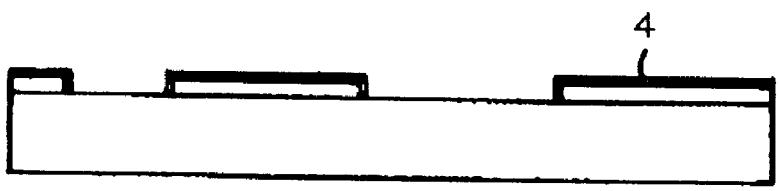

Then, the resist 3 is etched by a depth in the range of 0.1 $\mu$m to 1 $\mu$m from a surface thereof by plasma-ashing in which oxygen gas is employed as a process gas. The resin, polyimide, is etched, but the silica particles contained in the resist 3 is not etched. Namely, only the silica particles remain unetched, and resultingly, appear on a surface of the resist 3. Thus, a silica particle layer 4 is formed over the resist 3, as illustrated in FIG. 2B.

Figure 2C:
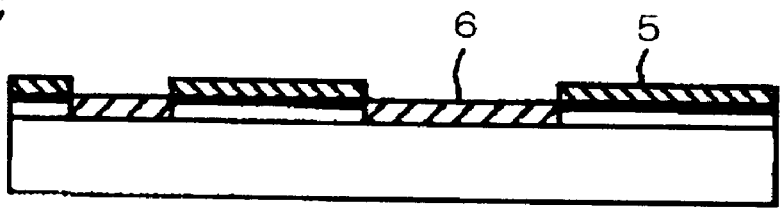
Figure 2D:
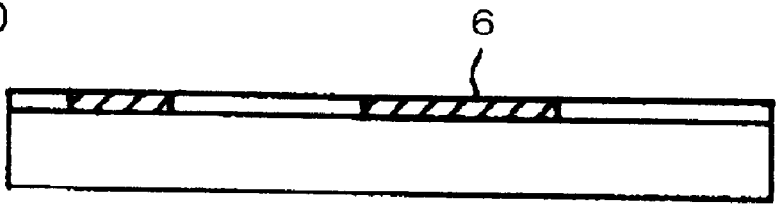

Then, as illustrated in FIG. 2C, a metal film 5 is formed over the product by a dry process such as sputtering or evaporation. The metal film 5 is made of aluminum, and has a thickness of a few micrometers. Then, the metal film 5 is flushed at a surface thereof. Since the silica particle layer 4 is removed by the flush from a surface of the resist 3, the metal film 5 formed on the silica particle layer 4 is also removed together with the silica particle layer 4. As a result, as illustrated in FIG. 2D, the metal film 5 remains only in the recesses 2, having the same thickness as that of the resist 3. Thus, an electrically conductive wiring pattern 6 made of aluminum and having the same thickness as that of the resist 3 is formed in the recesses 2.

In accordance with the above-mentioned first embodiment, it is possible to equalize a thickness of the wiring pattern 6 to a thickness of the resist 3 to thereby ensure a product having a planarized upper surface without steps caused by wiring patterns. Hence, it is possible to have a multi-layered wiring structure by repeating the above-mentioned steps having been described with reference to FIGS. 2A to 2D.

Figure 2E:
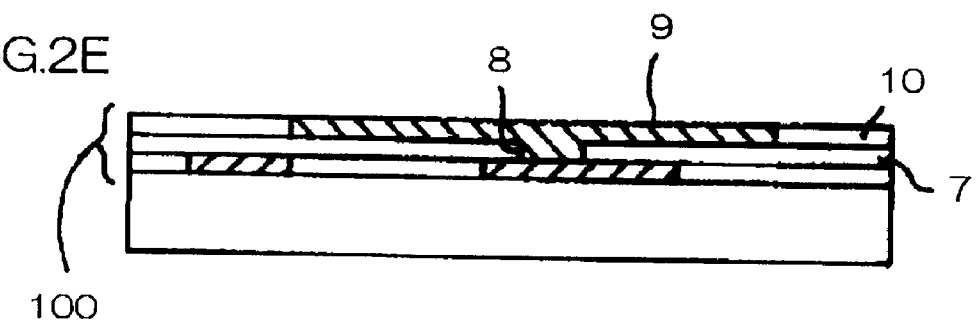

Specifically, as illustrated in FIG. 2E, an interlayer insulating film 7 is formed over the product illustrated in FIG. 2D, and then there is formed a via-hole 8 throughout the insulating film 7. Then, a second electrically conductive wiring pattern 9 and a second resist 10 are formed over the insulating film 7 in the same manner as explained with reference to FIGS. 2A to 2D. As a result, as illustrated in FIG. 2E, there can be obtained a multi-layered wiring structure 100 having a planarized surface and high reliability in insulation, even if the interlayer insulating film 7 was formed thin.

Material of which the substrate 1 is made is not to be limited to particular one. For instance, the substrate 1 may be made of a silicon wafer, a glass substrate, a printed board, a metal plate having an insulating film formed thereon, a substrate having a metal wiring layer formed thereon and an insulating film formed over the metal wiring layer, or a polyimide film.

The coating agent to be used for forming the silica particle containing resist 3 may be composed of any resin. For instance, there may be used a coating agent comprising a mixture of varnish-like resist such as a photoresist available from Tokyo Ouka Industry under the tradename of OFPR-8600, and silica particles scattered thereinto.

The silica particle containing resist 3 is preferably composed of silica particles having a diameter of 5 $\mu$m or smaller, more preferably 1 $\mu$m or smaller, and epoxy acrylate having a fluorene skeleton. This resist ensures the formation of an electrically conductive wiring pattern having a higher density and a smaller width and providing high reliability in insulation performance with a high fabrication yield, even if the wiring pattern is to be formed in a large area. This is because epoxy acrylate having a fluorene skeleton has superior resolution, heat resistance, moisture resistance, and chemical resistance, and as a result, presents high reliability in insulation.

The reason for that it is preferable that the silica particle has a diameter of 5 $\mu$m or smaller is that if the diameter is greater than 5 $\mu$m, the resolution would be deteriorated, and the silica particle containing resist has to be etched by plasma-ashing to greater degree, which is accompanied with reduction in productivity.

Second Embodiment

The method of forming an electrically conductive wiring pattern in accordance with the second embodiment is explained hereinbelow with reference to FIGS. 3A to 3E. In this embodiment, there is used a resist composed of silica particles having a diameter of 5 $\mu$m or smaller, and epoxy acrylate having a fluorene skeleton.

Figure 3A:
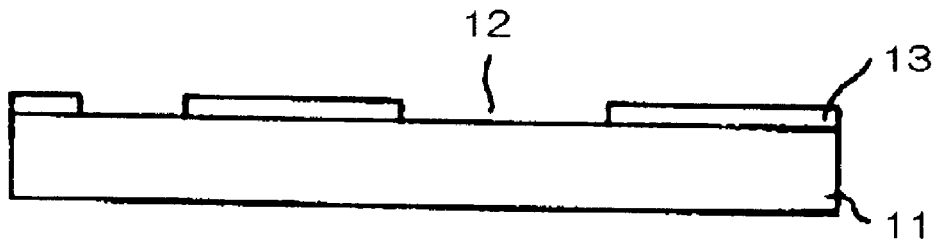
FIGS. 3A to 3E are cross-sectional views of a substrate on which an electrically conductive wiring pattern is formed, illustrating respective steps in a method of forming an electrically conductive wiring pattern in accordance with the second embodiment of the present invention.

First, as illustrated in FIG. 3A, a resist 13 is patterned on a glass substrate 11 so that the resist 13 has a plurality of recesses 12 where an electrically conductive wiring pattern is to be formed, as follows.

There is used a coating agent composed of molten silica particles having a diameter of 10 $\mu$m, and epoxy acrylate having a fluorene skeleton. The coating agent is applied to cover entirely a surface of the glass substrate 11 by spin-coating so that the resist 13 has a thickness of 1.2 $\mu$m after drying. Then, the coating agent is dried at 75° C. for 10 minutes, exposed to a light at 100 mJ/cm$^2$, developed in an aqueous solution containing 1%-sodium carbonate, and then cured by being heated at 150° C. for one hour. Thus, the silica particle containing resist 13 having the recesses 12 is patterned on the glass substrate 11, as illustrated in FIG. 3A.

Figure 3B:
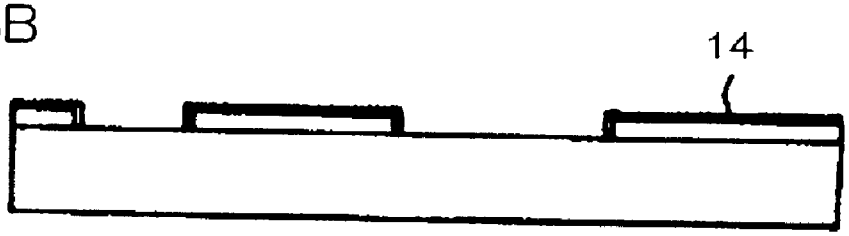

Then, the resist 13 is etched by a depth of about 0.1 $\mu$m by plasma-ashing in which oxygen gas is employed as a process gas, to thereby form a silica particle layer 14 over the resist 13, as illustrated in FIG. 3B.

Figure 3C:
Figure 3D:
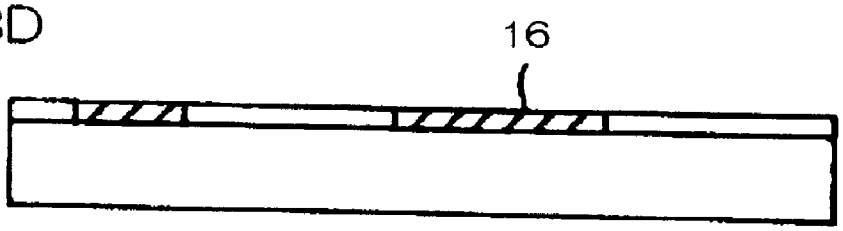

Then, as illustrated in FIG. 3C, a metal film 15 is formed over the product by a dry process such as sputtering or evaporation. The metal film 15 is made of aluminum, and has a thickness of 1 μm. Then, the metal film 15 is flushed at a surface thereof. Since the silica particle layer 14 is removed by the flush from a surface of the resist 13, the metal film 15 formed on the silica particle layer 14 is also removed together with the silica particle layer 14. As a result, as illustrated in FIG. 3D, the metal film 15 remains only in the recesses 12, having the same thickness as that of the resist 13. Thus, an electrically conductive wiring pattern 16 made of aluminum and having the same thickness as that of the resist 13 is formed in the recesses 12, as illustrated in FIG. 3D.

Figure 3E:
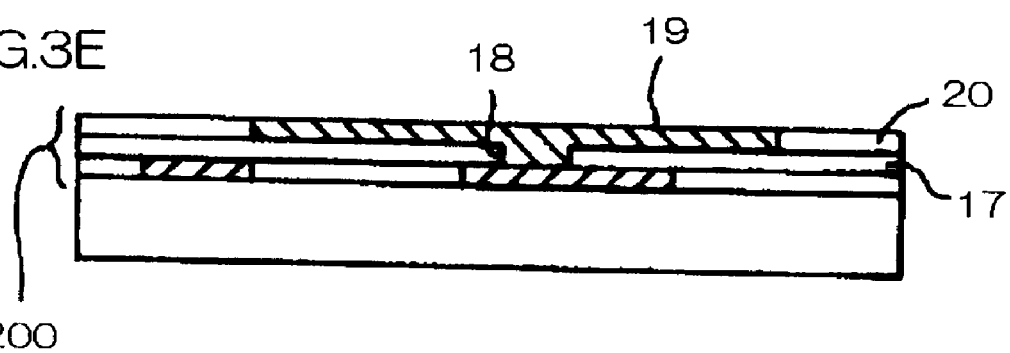

Then, as illustrated in FIG. 3E, an interlayer insulating film 17 is formed over the product illustrated in FIG. 3D, and then there is formed a via-hole 18 throughout the insulating film 17. Then, a second electrically conductive wiring pattern 19 and a second resist 20 are formed over the insulating film 17 in the same manner as explained with reference to FIGS. 3A to 3D. As a result, as illustrated in FIG. 3E, there can be obtained a multi-layered wiring structure 200 having a planarized surface and high reliability in insulation.

There was formed a 1 μm-thick aluminum wiring pattern on a 300 mm×300 mm glass substrate in accordance with the above-mentioned second embodiment, in order to test the resolution of the wiring pattern. The result was that there could be formed a pattern having a line and space of 0.8 μm/0.8 μm at a minimum.

As a comparison there was also formed a pattern by using a resist containing no silica particles therein. The resist was formed with a plurality of recesses similarly to the resists 13 in the above-mentioned second embodiment. Then, an electrically conductive wiring pattern was formed in the recesses in accordance with the process having been explained with reference to FIGS. 1A to 1E. Though there were used belt sanders or buffers having abrasive powders having a variety of diameters for removing a metal film formed on the resist, the result was that there could be formed a pattern having a line and space of 100 μm/100 μm at a minimum.

This fact shows that the method in accordance with the second embodiment can provide an electrically conductive wiring pattern having a higher density and a smaller width than those of conventional methods.

Third Embodiment

The method of forming an electrically conductive wiring pattern in accordance with the third embodiment is explained hereinbelow with reference to FIGS. 4A to 4F. In this embodiment, an electrically conductive wiring pattern is comprised of a plurality of metal layers.

Figure 4A:
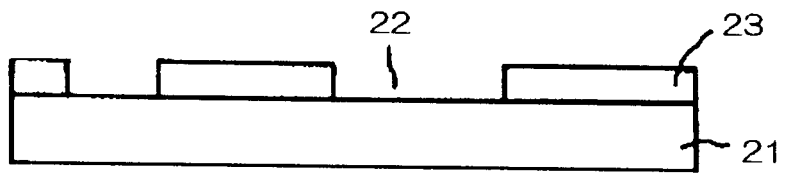
FIGS. 4A to 4F are cross-sectional views of a substrate on which an electrically conductive wiring pattern is formed, illustrating respective steps in a method of forming an electrically conductive wiring pattern in accordance with the third embodiment of the present invention.

First, as illustrated in FIG. 4A, a resist 23 is patterned on an FR-4 epoxy printed substrate 21 so that the resist 23 has a plurality of recesses 22 where an electrically conductive wiring pattern is to be formed, as follows.

There is used a coating agent composed of molten silica particles having a diameter of 30 nm, and epoxy acrylate having a fluorene skeleton. The coating agent is applied to cover entirely a surface of the substrate 21 by curtain-coating so that the resist 23 has a thickness of 20 μm after drying. Then, the coating agent is dried at 75° C. for 20 minutes, exposed to a light at 400 mJ/cm$^2$, developed in an aqueous solution containing 1%-sodium carbonate, and then cured by being heated at 150° C. for one hour. Thus, the silica particle containing resist 23 having a plurality of the recesses 22 is patterned on the substrate 21, as illustrated in FIG. 4A.

Figure 4B:
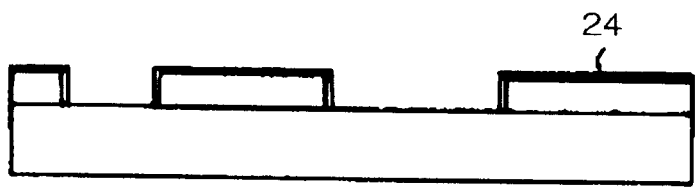

Then, the silica particle containing resist 23 is etched by a depth of about 0.1 μm by plasma-ashing in which oxygen gas is employed as a process gas, to thereby form a silica particle layer 24 over the resist 23, as illustrated in FIG. 4B.

Figure 4C:
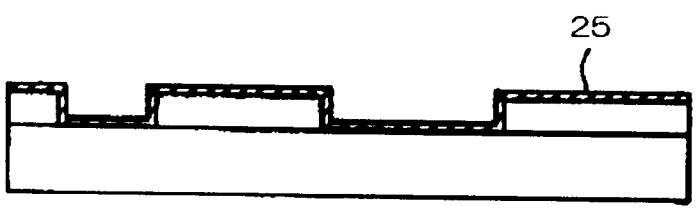

Then, as illustrated in FIG. 4C, a metal film 25 is formed over the product by sputtering. The metal film 25 is comprised of a 0.05 μm-thick chromium (Cr) layer and a 0.05 μm-thick palladium (Pd) layer. Then, the metal film 25 is flushed at a surface thereof to thereby remove a portion of the metal film 25 formed on the resist 23. As a result, the metal film 25 remains only in the recesses 22. Thus, an electrically conductive wiring pattern 26a composed of Cr and Pd layers is formed in the recesses 22, as illustrated in FIG. 4D.

Figure 4D:
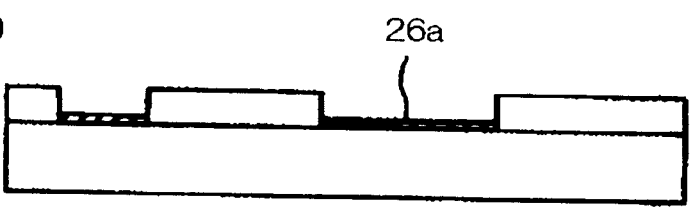
Figure 4E:
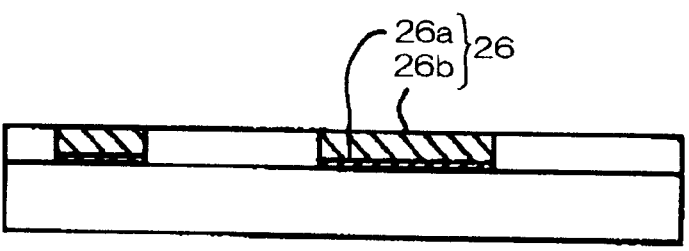

Then, as illustrated in FIG. 4E, a second metal film 26b is deposited on the wiring pattern 26a by electroless deposition. The second metal film 26b is composed of copper (Cu), for instance. The wiring pattern 26a and the second metal film 26b cooperate with each other to thereby form an electrically conductive wiring pattern 26. In the instant embodiment, the second metal film 26b is designed to have such a thickness that a total thickness of the wiring pattern 26a and the second metal film 26b is equal to a thickness of the silica particle containing resist 23, namely 20 μm. Thus, as illustrated in FIG. 4E, it is possible to form the electrically conductive wiring pattern 26 having a planarized surface.

It should be noted that the second metal film 26b might be designed to have such a thickness that a total thickness of the wiring pattern 26a and the second metal film 26b is smaller than the thickness of the silica particle containing resist 23. Namely, the electrically conductive wiring pattern 26 can be designed to have a desired thickness.

Figure 4F:
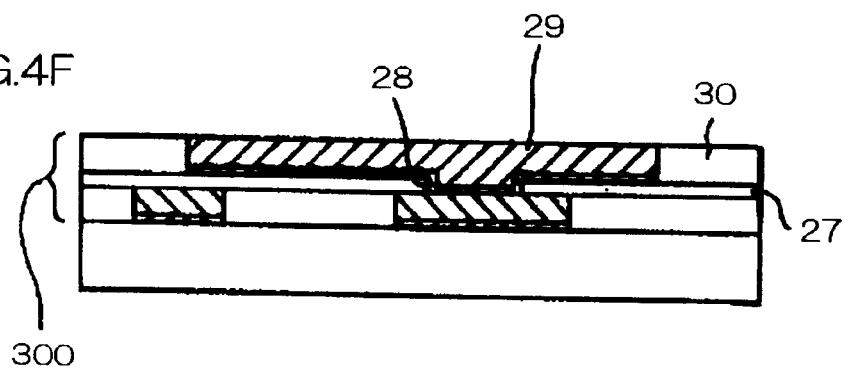

Then, as illustrated in FIG. 4F, an interlayer insulating film 27 is formed over the product illustrated in FIG. 4D, and then there is formed a via-hole 28 throughout the insulating film 27. Then, a second electrically conductive wiring pattern 29 and a second resist 30 are formed over the insulating film 27 in the same manner as explained with reference to FIGS. 4A to 4E. As a result, as illustrated in FIG. 4F, there can be obtained a multi-layered wiring structure 300 having a planarized surface without steps caused by wiring patterns, and high reliability in insulation.

There was formed a 20 μm-thick copper wiring pattern on a 330 mm×330 mm FR-4 epoxy printed substrate in accordance with the above-mentioned third embodiment, in order to test the resolution of the wiring pattern 26. The result was that there could be formed a pattern having a line and space of 20 μm/20 μm at a minimum.

As a comparison, there was also formed a pattern by using a resist containing no silica particles therein. The resist was formed with a plurality of recesses similarly to the resists 23 in the above-mentioned third embodiment. Then, an electrically conductive wiring pattern was formed in the recesses in accordance with the process having been explained with reference to FIGS. 1A to 1E. Though there were used belt sanders or buffers having abrasive powders having a variety of diameters for removing a metal film formed on the resist, the result was that there could be formed a pattern having a line and space of 150 μm/150 μm at a minimum.

This fact shows that the method in accordance with the third embodiment can provide an electrically conductive wiring pattern having a higher density and a smaller width than those of conventional methods.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-49527 filed on Mar. 5, 1997 including specification, claims, drawings and summary is incorporated herein by reference in its entirety.

What is claimed is:

1. A method of forming an electrically conductive wiring pattern, comprising the steps in sequence of:

(a) patterning a resist containing etch resistant particles therein on a substrate so that said resist has at least one recess where an electrically conductive wiring is to be formed, said substrate appearing in said recess;

(b) etching said resist so as to remove a portion of said resist whereby to expose etch resistant particles on a surface of said resist while leaving another portion of said resist and said etch resistant particles on said substrate;

(c) forming a metal film to a thickness of the height of said recess over both said another portion of said resist and said substrate appearing in said recess; and (d) removing said metal film formed on said resist together with said exposed etch resistant particles.

2. The method as set forth in claim 1, wherein said metal film is formed in said step (c) so as to have the same height as that of said resist.

3. The method as set forth in claim 1, wherein said metal film formed in said step (c) is formed in two steps, a first step in which a metal film is formed so as to have a smaller height as a height of said resist, and a second step of forming a second metal film on said metal film to the height of said resist.

4. The method as set forth in claim 3, wherein said second metal film is formed so that a total height of said metal film and said second metal film is equal to a height of said resist.

5. The method as set forth in claim 3, wherein said second metal film is composed of a metal different from a metal of which said metal film is composed.

6. The method as set forth in claim 3, wherein said second metal film is comprised of a plurality of layers.

7. The method as set forth in claim 1, wherein said particles comprise a metal oxide.

8. The method as set forth in claim 1, wherein said etching in said step (b) is carried out by plasma-ashing.

9. A method of forming a multi-layered wiring structure, comprising the steps in sequence of:

(a) patterning a resist containing etch resistant particles therein on a substrate so that said resist has at least one recess where an electrically conductive wiring is to be formed, said substrate appearing in said recess;

(b) etching said resist so as to remove a portion of said resist whereby to expose etch resistant particles on a surface of said resist while leaving another portion of said resist and said etch resistant particles on said substrate;

(c) forming a metal film to a thickness of the height of said recess over both said another portion of said resist and said substrate appearing in said recess;

(d) removing said metal film formed on said resist together with said exposed etch resistant particles;

(e) forming an interlayer insulating film over the product of said step (d);

(f) forming a via-hole leading to said metal film formed over said substrate appearing in said recess;

(g) patterning a resist containing etch resistant particles therein on the product of said step (f) so that said resist has at lease one recess where an electrically conductive wiring is to be formed, said product of said step (f) appearing in said recess;

(h) repeating steps (b) to (g) a desired number of times; and (i) repeating steps (b) to (d).

10. The method as set forth in claim 9, wherein said metal film is formed in said step (c) so as to have the same height as that of said resist.

11. The method as set forth in claim 9, wherein said metal film formed in said step (c) is formed in two steps, a first step in which a metal is formed so as to have a smaller height as that of said resist, and a second step of forming a second metal film on said metal film to the height of said recess.

12. The method as set forth in claim 11, wherein said second metal film is formed so that a total height of said metal film and said second metal film is equal to a height of said resist.

13. The method as set forth in claim 11, wherein said second metal film is composed of a metal different from a metal of which said metal film is composed.

14. The method as set forth in claim 11, wherein said second metal film is comprised of a plurality of layers.

15. The method as set forth in claim 9, wherein said particles comprise a metal oxide.

16. The method as set forth in claim 9, wherein said etching in said step (b) is carried out by plasma-ashing.

17. A method of forming an electrically conductive wiring pattern, comprising the steps in sequence of:

(a) patterning a resist containing etch resistant silicon dioxide particles therein on a substrate so that said resist has at least one recess where an electrically conductive wiring is to be formed, said substrate appearing in said recess;

(b) etching said resist so as to remove a portion of said resist whereby to expose said etch resistant silicon dioxide particles on a surface of said resist while leaving another portion of said resist and said etch resistant particles on said substrate;

(c) forming a metal film to a thickness of the height of said recess over both said another portion of said resist and said substrate appearing in said recess; and (d) removing said metal film formed on said resist together with said etch resistant silicon dioxide particles.

18. The method as set forth in claim 17, wherein said resist comprises silicon dioxide particles having a diameter of 5 $\mu$m or smaller, and an epoxy acrylate having a fluorene skeleton.

19. The method as set forth in claim 18, wherein said etch resistant silicon dioxide particles have a diameter of 1 $\mu$m or smaller.

20. The method as set forth in claim 17, wherein said metal film is formed in said step (c) in a dry condition.

21. The method as set forth in claim 17, wherein said etch resistant silicon dioxide particles are removed in said step (d) by spray-flushing.

22. The method as set forth in claim 17, wherein said resist comprises a photosensitive resin containing etch resistant silicon dioxide particles therein.

23. The method as set forth in claim 22, wherein said resin comprises a polyimide.

24. The method as set forth in claim 17, wherein said etching in said step (b) is carried out by plasma-ashing.

25. The method as set forth in claim 17, wherein said metal film is formed in said step (c) so as to have the same height as that of said resist.

26. The method as set forth in claim 17, wherein said metal film formed in said step (c) is formed in two steps, a first step in which a metal film is formed so as to have a smaller height as a height of said resist, and a second step of forming a second metal film on said metal film to the height of said recess.

27. The method as set forth in claim 26, wherein said second metal film is formed so that a total height of said metal film and said second metal film is equal to a height of said resist.

28. The method as set forth in claim 26, wherein said second metal film comprises copper.

29. The method as set forth in claim 26, wherein said second film is formed by electroless deposition.

30. The method as set forth in claim 17, wherein said metal film is comprised of a plurality of layers including at least a copper layer and a palladium layer.

31. A method of forming a multi-layered wiring structure, comprising the steps in sequence of:

(a) patterning a resist containing etch resistant silicon dioxide particles therein on a substrate so that said resist has at least one recess where an electrically conductive wiring is to be formed, said substrate appearing in said recess;

(b) etching said resist so as to remove a portion of said resist whereby to expose said etch resistant silicon dioxide particles on a surface of said resist while leaving another portion of said resist and said etch resistant particles on said substrate;

(c) forming a metal film to a thickness of the height of said recess over both said another portion of said resist and said substrate appearing in said recess;

(d) removing said metal film formed on said resist together with said etch resistant silicon dioxide particles;

(e) forming an interlayer insulating film over the product of said step (d);

(f) forming a via-hole leading to said metal film formed over said substrate appearing in said recess;

(g) patterning a resist containing etch resistant silicon dioxide particles therein on the product of said step (f) so that resist has at least one recess where an electrically conductive wiring is to be formed, said product of said step (f) appearing in said recess;

(h) repeating steps (b) to (g) a desired number of times; and (i) repeating steps (b) to (d).

32. The method as set forth in claim 31, wherein said resist comprises silicon dioxide particles having a diameter of 5 μm or smaller, and an epoxy acrylate having a fluorene skeleton.

33. The method as set fort in claim 32, wherein said etch resistant silicon dioxide particles have a diameter of 1 μm or smaller.

34. The method as set forth in claim 31, wherein said metal film is formed in said step (c) in a dry condition.

35. The method as set forth in claim 31, wherein said silicon dioxide particles are removed in said step (d) by spray-flushing.

36. The method as set forth in claim 31, wherein said resist comprises a photosensitive resin containing etch resistant silicon dioxide particles therein.

37. The method as set forth in claim 36, wherein said resin comprises a polyimide.

38. The method as set forth in claim 31, wherein said etching in said step (b) is carried out by plasma-ashing.

39. The method as set forth in claim 31, wherein said metal film is formed in said step (c) so as to have the same height as that of said resist.

40. The method as set forth in claim 31, wherein said metal film formed in said step (c) is formed in two steps, a first step in which a metal film is formed so as to have a smaller height as a height of said resist, and a second step of forming a second metal film on said metal film to the height of said recess.

41. The method as set forth in claim 40, wherein said second metal film is formed so that a total height of said metal film and said second metal film is equal to a height of said resist.

42. The method as set forth in claim 40, wherein said second metal film comprises copper.

43. The method as set forth in claim 40, wherein said second film is formed by electroless deposition.

44. The method as set forth in claim 31, wherein said metal film is comprised of a plurality of layers including at least a copper layer and a palladium layer.

* * * * *